US008562272B2

(12) United States Patent
Lenz

(10) Patent No.: US 8,562,272 B2
(45) Date of Patent: *Oct. 22, 2013

(54) SUBSTRATE LOAD AND UNLOAD MECHANISMS FOR HIGH THROUGHPUT

(75) Inventor: Eric H. Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 690 days.

This patent is subject to a terminal disclaimer.

(21) Appl. No.: 12/706,397

(22) Filed: Feb. 16, 2010

(65) Prior Publication Data

US 2011/0200415 A1    Aug. 18, 2011

(51) Int. Cl.
*B25J 11/00* (2006.01)
*B25J 9/04* (2006.01)
*H01L 21/677* (2006.01)

(52) U.S. Cl.
USPC ............... 414/217; 414/226.05; 414/744.2; 414/939

(58) Field of Classification Search
USPC .................... 414/226.05, 217, 939, 744.2
See application file for complete search history.

(56) References Cited

U.S. PATENT DOCUMENTS

| 4,851,018 | A | 7/1989 | Lazzari et al. |
| 4,890,780 | A | 1/1990 | Mimata et al. |
| 5,096,364 | A | 3/1992 | Messer et al. |
| 5,188,136 | A | 2/1993 | Kumagai |
| 5,207,548 | A | 5/1993 | Suffel |
| 5,229,615 | A | 7/1993 | Brune et al. |
| 5,295,777 | A | 3/1994 | Hodos |
| 5,425,793 | A | 6/1995 | Mori et al. |
| 5,451,130 | A | 9/1995 | Kempf |
| 5,525,106 | A | 6/1996 | Iizuka et al. |
| 5,679,405 | A | 10/1997 | Thomas et al. |
| 5,765,444 | A | 6/1998 | Bacchi et al. |
| 5,843,233 | A | 12/1998 | van de Ven et al. |

(Continued)

FOREIGN PATENT DOCUMENTS

| CN | 102770954 A | 11/2012 |
| JP | 237742 A | 2/1990 |

(Continued)

OTHER PUBLICATIONS

"U.S. Appl. No. 12/730,880 , Response filed May 17, 2012 to Non Final Office Action mailed Feb. 24, 2012", 17 pgs.

(Continued)

*Primary Examiner* — Scott Lowe
(74) *Attorney, Agent, or Firm* — Schwegman Lundberg & Woessner, P.A.

(57) ABSTRACT

In various exemplary embodiments described herein, a system includes a plurality of carrier arms each having concentrically mounted midpoints between opposing ends of the carrier arms with a wafer carrier mounted on each of the opposing ends of the carrier arms. A hub includes a plurality of concentrically mounted drives where each of the plurality of drives is coupled near the midpoint of a respective one of the plurality of carrier arms. Each of the plurality of drives is configured to be controlled independently of the remaining plurality of concentrically mounted drives. A respective motor is coupled to each of the concentrically mounted drives and is configured to move the coupled carrier arm in a rotary manner. A linear wafer transport mechanism moves wafers to or from select ones of the wafer carriers on the plurality of carrier arms to an easy handoff location for a load/unload robot.

14 Claims, 7 Drawing Sheets

(56) References Cited

U.S. PATENT DOCUMENTS

| | | |
|---|---|---|
| 5,951,770 A | 9/1999 | Perlov et al. |
| 5,979,475 A | 11/1999 | Satoh et al. |
| 6,048,162 A | 4/2000 | Moslehi |
| 6,050,891 A | 4/2000 | Nering |
| 6,082,950 A | 7/2000 | Altwood et al. |
| 6,097,469 A | 8/2000 | Yaegashi et al. |
| 6,155,768 A | 12/2000 | Bacchi et al. |
| 6,158,951 A | 12/2000 | Carr et al. |
| 6,328,872 B1 | 12/2001 | Talieh et al. |
| 6,368,183 B1 | 4/2002 | Trojan et al. |
| 6,409,453 B1 | 6/2002 | Brodine et al. |
| 6,429,139 B1 | 8/2002 | Ryan et al. |
| 6,485,250 B2 | 11/2002 | Hofmeister |
| 6,561,798 B2 | 5/2003 | Kuznetsov et al. |
| 6,882,416 B1 | 4/2005 | Hunter et al. |
| 7,014,672 B2 | 3/2006 | Ishihara et al. |
| 7,255,633 B2 | 8/2007 | Muldowney |
| 7,276,097 B2 | 10/2007 | Edo |
| 7,527,664 B2 | 5/2009 | Jackson |
| 8,007,218 B2 * | 8/2011 | Park et al. ............ 414/217 |
| 8,282,698 B2 | 10/2012 | Lenz |
| 2002/0061248 A1 * | 5/2002 | Tepman ............ 414/744.5 |
| 2002/0075478 A1 | 6/2002 | Nulman et al. |
| 2002/0127091 A1 | 9/2002 | Lowrance et al. |
| 2003/0202865 A1 | 10/2003 | Ponnekanti et al. |
| 2004/0013497 A1 | 1/2004 | Shirai |
| 2004/0076505 A1 | 4/2004 | Kinnard et al. |
| 2004/0144316 A1 | 7/2004 | Lee et al. |
| 2007/0034479 A1 | 2/2007 | Todaka |
| 2007/0224820 A1 | 9/2007 | Lim et al. |
| 2007/0295274 A1 | 12/2007 | Webb et al. |
| 2008/0031710 A1 | 2/2008 | Moriya et al. |
| 2008/0175694 A1 * | 7/2008 | Park et al. ............ 414/217.1 |
| 2009/0022571 A1 | 1/2009 | Krupyshev et al. |
| 2009/0081005 A1 | 3/2009 | Miyasaka |
| 2009/0245984 A1 | 10/2009 | Lenz |
| 2011/0232771 A1 | 9/2011 | Lenz |
| 2011/0236159 A1 | 9/2011 | Lenz |

FOREIGN PATENT DOCUMENTS

| | | |
|---|---|---|
| JP | 3212951 A | 9/1991 |
| JP | 200313223 A | 1/2003 |
| JP | 2003068819 A | 3/2003 |
| JP | 2003229466 A | 8/2003 |
| JP | 2004193418 A | 7/2004 |
| JP | 2004200329 A | 7/2004 |
| JP | 200628577 A | 2/2006 |
| KR | 1020020062562 A | 7/2002 |
| KR | 1020070107361 A | 11/2007 |
| KR | 100803559 B1 | 2/2008 |
| WO | WO-0033359 A2 | 6/2000 |
| WO | WO-2007126289 A1 | 11/2007 |
| WO | WO-2007129838 A1 | 11/2007 |
| WO | WO-2008140728 A2 | 11/2008 |
| WO | WO-2009120360 A2 | 10/2009 |
| WO | WO-2009120360 A3 | 1/2010 |
| WO | WO-2011102952 A3 | 8/2011 |
| WO | WO-2011119729 A2 | 9/2011 |
| WO | WO-2011119729 A3 | 9/2011 |
| WO | WO-2011119733 A2 | 9/2011 |
| WO | WO-2011119733 A3 | 9/2011 |

OTHER PUBLICATIONS

"U.S. Appl. No. 12/730,880, Non Final Office Action mailed Feb. 24, 2012", 7 pgs.

"U.S. Appl. No. 12/730,880, Notice of Allowance mailed Jun. 7, 2012", 8 pgs.

"International Application Serial No. PCT/US2011/029623, International Search Report mailed Nov. 28, 2011", 3 pgs.

"International Application Serial No. PCT/US2011/029623, Written Opinion mailed Nov. 28, 2011", 3 pgs.

"International Application Serial No. PCT/US2011/029628, International Search Report mailed Nov. 30, 2011", 3 pgs.

"International Application Serial No. PCT/US2011/029628, Written Opinion mailed Nov. 30, 2011", 3 pgs.

"U.S. Appl. No. 12/145,707, Final Office Action mailed Aug. 26, 2011", 13 pgs.

"U.S. Appl. No. 12/145,707, Non Final Office Action mailed Mar. 16, 2011", 11 pgs.

"U.S. Appl. No. 12/145,707, Response filed Feb. 1, 2011 to Restriction Requirement mailed Jan. 25, 2011", 9 pgs.

"U.S. Appl. No. 12/145,707, Response filed Jun. 16, 2011 to Non Final Office Action mailed Mar. 16, 2011", 13 pgs.

"U.S. Appl. No. 12/145,707, Restriction Requirement mailed Jan. 25, 2011", 7 pgs.

"International Application Serial No. PCT/US2009/01900, International Preliminary Report on Patentability mailed Oct. 7, 2010", 8 pgs.

"International Application Serial No. PCT/US2011/022870, International Search Report mailed Oct. 31, 2011", 3 pgs.

"International Application Serial No. PCT/US2011/022870, Written Opinion mailed Oct. 31, 2011", 3 pgs.

"International Application Serial No. PCT/US2009/001900, International Search Report and Written Opinion mailed Nov. 24, 2009", 14 pgs.

"U.S. Appl. No. 12/730,868, Final Office Action mailed Dec. 31, 2012", 11 pgs.

"U.S. Appl. No. 12/730,868, Non Final Office Action mailed Oct. 1, 2012", 12 pgs.

"U.S. Appl. No. 12/730,868, Response filed Dec. 7, 2012 to Non Final Office Action mailed Oct. 1, 2012", 15 pgs.

"European Application Serial No. 09724813.2, Extended Search Report mailed Nov. 7, 2012", 8 pgs.

"International Application Serial No. PCT/US2011/022870, International Preliminary Report on Patentability mailed Aug. 30, 2012", 5 pgs.

"International Application Serial No. PCT/US2011/029623, International Preliminary Report on Patentability mailed Oct. 4, 2012", 5 pgs.

"International Application Serial No. PCT/US2011/029628, International Preliminary Report on Patentability mailed Oct. 4, 2012", 5 pgs.

"U.S. Appl. No. 12/730,868, Response filed May 29, 2013 to Final Office Action mailed Dec. 31, 2012", 18 pgs.

* cited by examiner

US 8,562,272 B2

SUBSTRATE LOAD AND UNLOAD MECHANISMS FOR HIGH THROUGHPUT

TECHNICAL FIELD

The present application relates generally to the field of semiconductor processing and, in a specific exemplary embodiment, to a system and method of rapidly transporting substrates within a processing chamber.

BACKGROUND

In the manufacture of semiconductor devices, process chambers are frequently interfaced to permit transfer of wafers or substrates, for example, between the interfaced chambers. The transfer is typically performed via transfer modules that move the wafers, for example, through slots or ports that are provided in adjacent walls of the interfaced chambers. Transfer modules are generally used in conjunction with a variety of wafer processing modules (PMs), which may include semiconductor etching systems, material deposition systems, and flat panel display etching systems.

Semiconductor device geometries (i.e., integrated circuit design rules) have decreased dramatically in size since such devices were first introduced several decades ago. Integrated circuits (ICs) have generally followed "Moore's Law," meaning that the number of devices that fit onto a single integrated circuit chip doubles every two years. Contemporary IC fabrication facilities ("fabs") routinely produce 65 nm (0.065 µm) feature size devices and smaller. Future fabs will soon be producing devices having even smaller feature sizes.

Perhaps more importantly, from a yield and cost basis standpoint, the types of equipment (e.g., process tools) used in the fabrication process is becoming a primary technology driver. The fabrication process must be effective, but it must also be fast. Contemporary throughput demands for current generations of 300 mm wafers in many applications are 360 wafers per hour. Currently, systems use only a single carrier linear wafer motion requiring a non-productive time period while the wafer carrier is returned to a starting point in a process tool. Thus, wafer handling is slow. Proposed solutions to increase throughput have focused on joining a plurality of process tools in parallel. While such solutions may increase wafer throughput, they do so at the expense of tool footprint, increased equipment costs, and reduced reliability. Accordingly, improvements are needed in the field of semiconductor processing with a special emphasis on equipment reliability, throughput, and efficiency.

BRIEF DESCRIPTION OF DRAWINGS

Various ones of the appended drawings merely illustrate exemplary embodiments of the present invention and cannot be considered as limiting its scope.

DETAILED DESCRIPTION

Figure 1A:
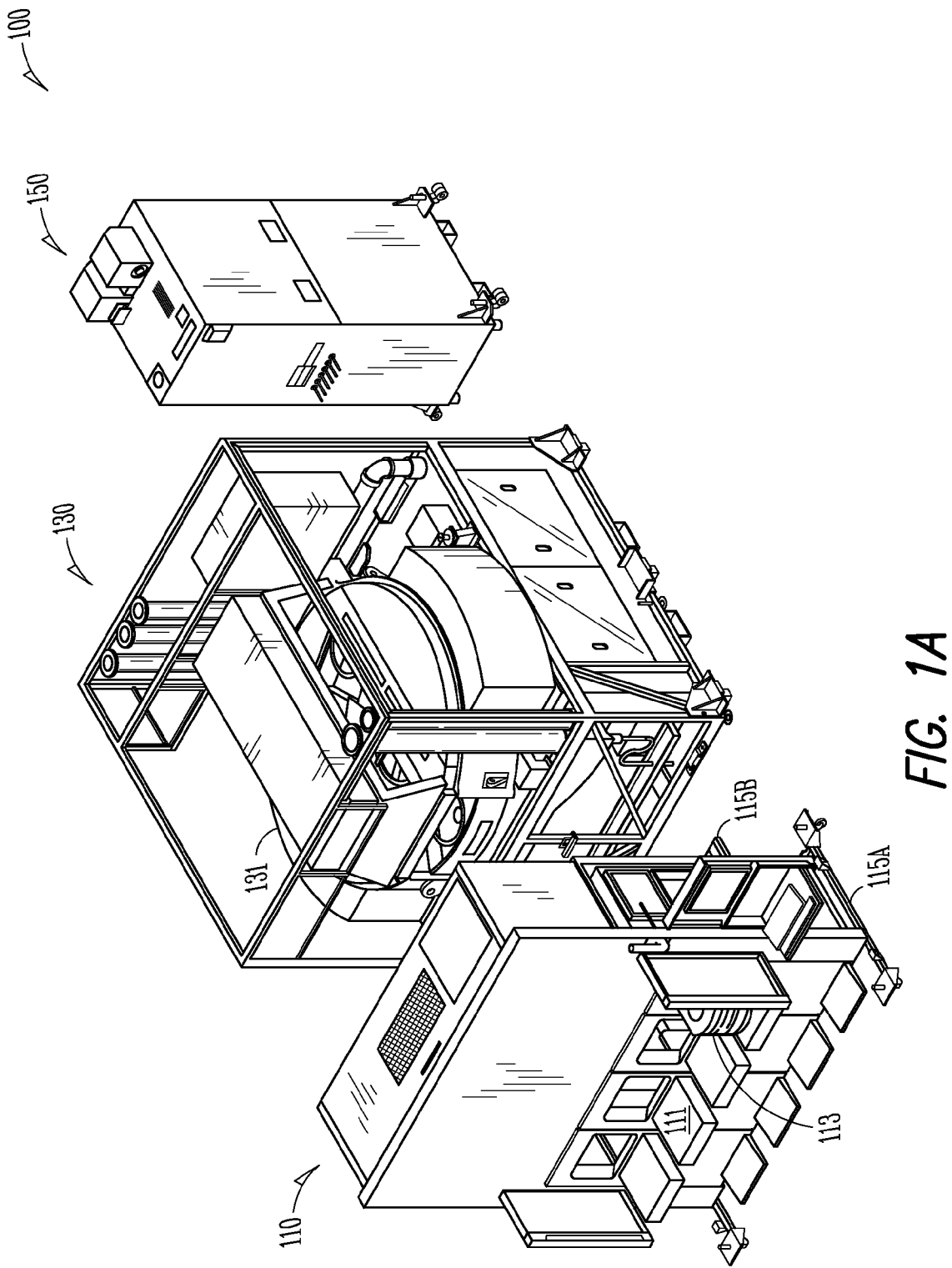
FIG. 1A is an exploded perspective view of an exemplary substrate processing tool, including an equipment front-end module (EFEM), a process module, and an electronics enclosure, incorporating at least aspects of the inventive subject matter described herein.

The description that follows includes illustrative systems, methods, and techniques that embody various aspects of the inventive subject matter. In the following description, for purposes of explanation, numerous specific details are set forth to provide an understanding of various embodiments of the inventive subject matter. It will be evident, however, to those skilled in the art that embodiments of the inventive subject matter may be practiced without these specific details. Further, well-known operations, structures, and techniques have not been shown in detail.

As used herein, the term "or" may be construed in either an inclusive or an exclusive sense. Similarly, the term "exemplary" is construed merely to mean an example of something or an exemplar and not necessarily a preferred or ideal means of accomplishing a goal. Additionally, although various exemplary embodiments discussed below focus on substrate transport mechanisms, the embodiments are given merely for clarity in disclosure. Thus, any type substrate transport mechanism can employ various embodiments of the system described herein and are considered as being within a scope of the present inventive subject matter.

Moreover, as used herein, the term "substrate" is simply chosen as a convenient term referring to any of various substrate types used in the semiconductor and allied industries. Substrate types may therefore include silicon wafers, compound wafers, thin film head assemblies, photomask blanks and reticles, or numerous other types of substrates known in the art.

In an exemplary embodiment, a substrate carrier system is disclosed. The substrate carrier system includes a number of carrier arms with each arm having a midpoint between opposing ends. The arms are arranged to rotate about the midpoint in planes parallel to one another with at least one substrate carrier mounted on each of the opposing ends. A hub with a number of concentrically mounted drives is coupled near the midpoint of each carrier arms. At least a portion of the carrier arms can be driven independently of a remaining portion of the arms. A drive motor is coupled to each of the concentrically mounted drives to move the carrier arms in a rotary manner. A linear traverser mechanism is coupled near the carrier arms. The traverser mechanism has a plurality of linear substrate carriers with each of the carriers being able to transport substrates in a plane substantially parallel to the planes of the carrier arms. Each of the linear substrate carriers is in a different plane from one another to allow transport of multiple substrates simultaneously.

In another exemplary embodiment, a wafer transport system providing a high wafer throughput is disclosed. The system includes a wafer-processing chamber with a number of carrier arms operating inside the processing chamber. Each of the carrier arms has concentrically mounted midpoints between opposing ends. The carrier arms are arranged to rotate about the midpoint in planes parallel to one another. A wafer carrier is mounted on each of the opposing ends of the carrier arms. A hub, having a plurality of concentrically mounted drives, is coupled near the midpoints of the carrier arms. At least a portion of the carrier arms can be driven independently of a remaining portion of the carrier arms. A drive motor is coupled to each of the concentrically mounted drives to move a coupled one of the carrier arms in a rotary manner. A linear traverser mechanism is coupled in proximity to the carrier arms. The linear traverser mechanism has a number of linear wafer carriers to transport wafers in a plane substantially parallel to the planes of the carrier arms. Each of the wafer carriers is in a different plane from one another to allow transport of multiple wafers simultaneously. At least one cleaning chemical-supply head is positioned proximate to a path of the wafer carriers.

In another exemplary embodiment, a linear traverser mechanism to transport substrates is disclosed. The linear traverser mechanism includes a number of substrate carriers to transport substrates in a plane substantially parallel with and distinct from one another, thereby allowing transport of multiple substrates simultaneously. At least two upper tracks and at least two lower tracks each have linear drive mechanisms separately coupled to the substrate carriers.

With reference to FIG. 1A, an exploded perspective view of pieces of equipment used to process substrates, such as semiconductor wafers, is shown. A processing tool 100 (commonly referred to as a process tool) is shown to include an equipment front-end module (EFEM) 110, a process module 130, and an electronics enclosure 150.

In operation, the EFEM 110, the process module 130, and the electronics enclosure 150 are unified as a single unit. The process module 130 includes a process chamber 131 in which various processes are performed on a batch of substrates. The processes may include various types of, for example, substrate cleaning and wet-etch (e.g., chemical etch) steps known independently in the semiconductor and related art fields. Additionally, the process module 130 is generally enclosed to reduce any particulate, organic, or other contamination of substrates within the process module 130 and the process chamber 131. Further, the enclosure (not shown) minimizes a risk of hazardous interactions between an equipment operator and moving mechanisms within the process module 130, thereby increasing safety of the operator. Operating power is supplied to the EFEM 110 and the process module 130 by the electronics enclosure 150.

The EFEM 110 is shown to include a number of substrate load stations 111, a first operator control interface 115A, and a second operator control interface 115B. From one of these control interfaces, an operator may input and run, for example, process recipes for a particular batch of substrates. The EFEM 110 is also shown to include a front opening unified pod (FOUP) 113 placed on one of the substrate load stations 111. The FOUP 113 is a particular type of plastic enclosure designed to hold semiconductor wafers (e.g., generally silicon wafers (Si) but may also include various other wafer types formed from elemental semiconductor materials such as germanium (Ge), or compound semiconductor materials such as gallium-arsenide (GaAs) or indium arsenide (InAs)). The FOUP 113 holds the wafers (not shown) securely and safely in a controlled environment. Although not shown explicitly in FIG. 1A, a skilled artisan will recognize readily that a FOUP may simultaneously be present on each of the substrate load stations 111. One or more robots (not shown) may be associated with each FOUP.

Once the FOUP 113 is placed on one of the substrate load stations 111, the robot (not shown) within the EFEM 110 may directly access the wafers contained within the FOUP 113. The EFEM 110 thus allows an operator to load and unload substrates from the FOUP 113 into the process chamber 131 via, for example, a two-bladed or four-blade robot (not shown but known independently in the art). Although not limited to a particular robot type, one robot that can be employed is, for example, a model FC06N, manufactured by Kawasaki (USA), Inc. of Wixom, Mich., USA. In a specific exemplary embodiment, the robot may incorporate a collapsive end-effector having four 3.8 mm blades with an approximate 10 mm spacing between adjacent blades. The 10 mm spacing is matched to the wafer-to-wafer spacing in a typical FOUP. Details of various transport processes occurring within the process chamber 131 are described in more detail with reference to FIGS. 4A, 4B, and 5, below.

Figure 1B:
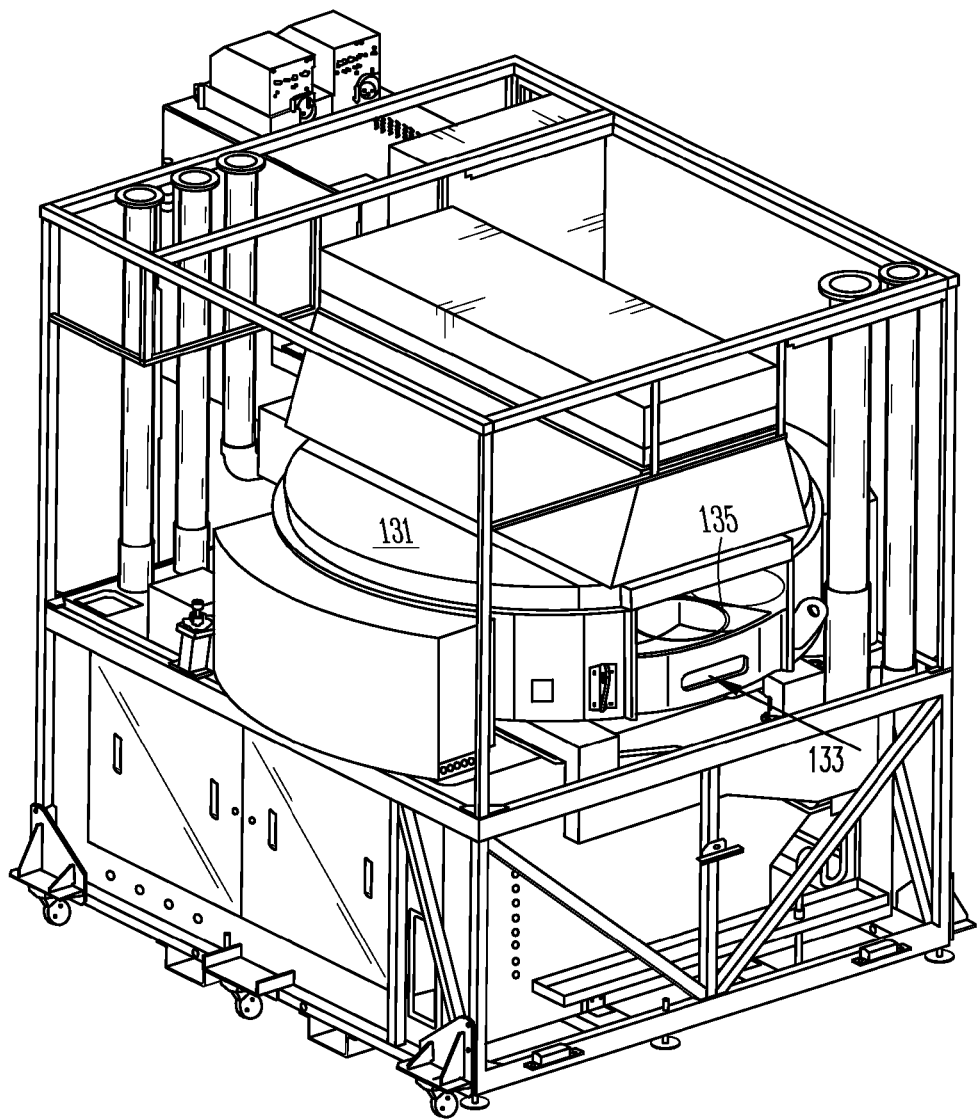
FIG. 1B is a perspective view of the process module of FIG. 1A including a process chamber.

Referring now to FIG. 1B and with concurrent reference to FIG. 1A, substrates (not shown) are transported by the robots from the FOUP 113 to one of a number of substrate carriers 135 (i.e., rotary-mounted substrate carriers) located on a clock-arm substrate carrier mechanism (not shown explicitly in either FIG. 1A or FIG. 1B but described in detail with reference to FIGS. 2 and 3, below). The substrate is loaded or unloaded into or out of the process chamber 131 through a substrate transport slot 133.

Figure 2:
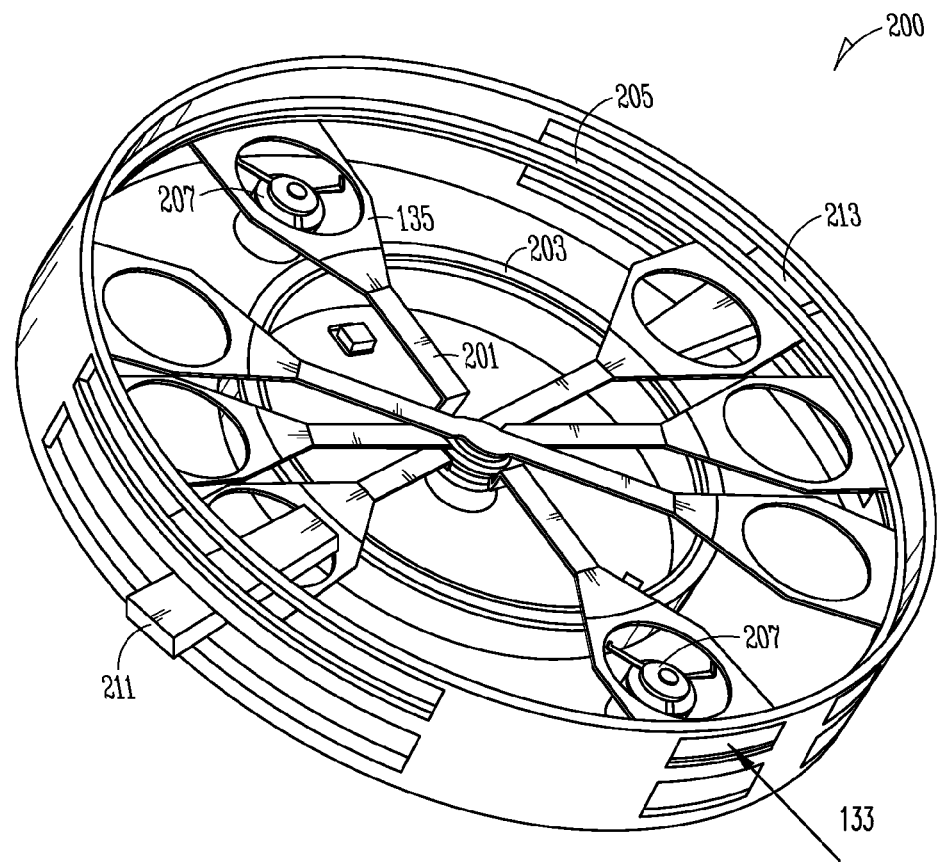
FIG. 2 is a perspective view of an exemplary clock-arm substrate carrier mechanism used within the process chamber of FIG. 1B.

FIG. 2 shows an exemplary embodiment of a clock-arm substrate carrier mechanism 200. The clock-arm substrate carrier mechanism 200 is shown to include a number of rotary arms 201, with each end of the rotary arms 201 having an associated one of the substrate carriers 135, an inner track section 203, an outer track section 205, and substrate lifters 207. As described in more detail, below, each of the rotary arms 201 may be driven independently and, thus, may be started, stopped, and accelerated independently of the remaining ones of the rotary arms 201. Additionally, although only four of the rotary arms 201 are shown, the clock-arm substrate carrier mechanism 200 can be adapted to handle any number of arms. The number of arms will be at least partially dependent upon a physical size of, for example, a diameter of the outer track section 205 and a physical size of each the substrate carriers 135. The rotary arms 201 and the substrate carriers 135 may be scaled as necessary to adapt to a given substrate size. For example, the substrate carriers 135 may be designed to accommodate 300 mm silicon wafers, 100 mm gallium arsenide (GaAs) wafers, or a next generation of 450 mm wafers.

In a specific exemplary embodiment, the outer track section 205 is physically arranged to accommodate a 30 inch (approx 760 mm) radius from midpoints of the rotary arms 201 to a center of the substrate carriers 135. As discussed, above, the outer track section 205 can be sized appropriately depending upon the number of rotary arms employed and the size of the substrates handled.

The substrate lifters 207 may be of any general type commonly known and used in the semiconductor industry. As shown, two instantiations of the substrate lifters 207 are spaced approximately 180° apart from one another. In other embodiments (not shown), there may a higher number of substrate lifters 207 used.

Additionally, one or both of the substrate lifters 207 may be rotated 180° to correct for the 180° rotation of a substrate through the clock-arm substrate carrier mechanism 200. The rotation occurs would thus occur between when moving a substrate between the clock arm carrier and the linear carrier as discussed, below. When only one of the substrate lifters 207 is rotating 180°, the 180° rotation occurs on the moving of a substrate from the clock carrier into the linear carrier and on the moving a substrate from the linear carrier to the clock carrier.

In general operation, once a particular one of the substrate carriers 135 is positioned over one of the substrate lifters 207, an external robot (not shown) may place a wafer to or from a substrate carrier (e.g., a wafer boat or the FOUP 113) onto one of the substrate lifters 207. The selected one of the substrate lifters 207 then lowers the substrate onto to the particular one of the substrate carriers 135 and the lifter continues to lower itself far enough to avoid any collisions with any of the rotary arms 201 or any other moving mechanisms contained within the clock-arm substrate carrier mechanism 200.

With continued reference to FIG. 2, the clock-arm substrate carrier mechanism 200 further includes an upper chemical-release head 211 and a lower chemical-release head 213 situated so as to spray or otherwise apply chemicals (e.g., such as various combinations of the cleaning or etching chemicals) as a substrate passes in proximity to the upper chemical-release head 211 and a lower chemical-release head 213. Utilizing at least two heads allows chemicals to be applied to both sides of a wafer in a single pass without a need to invert the substrate. Alternatively, the upper chemical-release head 211 and a lower chemical-release head 213 may be arranged to apply chemicals to both sides of a substrate simultaneously. As will be recognizable to a skilled artisan, any number of chemical-release heads may be utilized.

In a specific exemplary embodiment, the upper chemical-release head 211 and a lower chemical-release head 213 are each designed in a "pie-section" shape, having a wider cross-sectional width at an outer periphery of the clock-arm substrate carrier mechanism 200 than at an inner periphery. The pie-section shape accommodates a higher angular velocity on the outermost portion of the substrate as compared with the inner portion. Thus, more chemicals may be delivered to an outer portion of the substrate through, for example, an increased number of spray nozzles directed at the substrate, thus insuring uniform chemical coverage over each face of the substrate.

As a result of various features described herein, the clock-arm substrate carrier mechanism 200 can provide for continuous flow manufacturing and lends itself to processing without significant temporal gaps between successive substrates. As noted above, wet chemical cleaning or etching can involve a number of various steps. Starting and stopping wet chemistry is hard to control, wasteful, and inefficient. The clock-arm substrate carrier mechanism 200 processes substrates in a continuous mode by having each of the substrate carriers 135 travel in a full 360° arc. Unlike various prior art systems that provide only linear systems requiring a 180° return in which no wafer cleaning or processing occurs, the clock-arm substrate carrier mechanism 200 may run parallel cleaning processes on opposing sides simultaneously. Consequently, chemical control can be shared, thereby reducing control system overhead and redundant circuitry. As such, chemical savings can be as much as 300% (i.e., a four-time reduction in chemical usage) from contemporary linear systems.

Within the process chamber 131 (see FIG. 1B), at least two parallel processes occur simultaneously: chemical control and substrate motion. As described in more detail with reference to FIG. 3, below, independent control of velocities and accelerations of the substrate carriers 135 allows for an exit step and for loading and unloading one or more substrates substantially simultaneously. The independent control of the substrate carriers 135 further allows a carrier to accelerate to catch up in a process flow once a carrier has been loaded or unloaded, also described in more detail, below.

Figure 3:
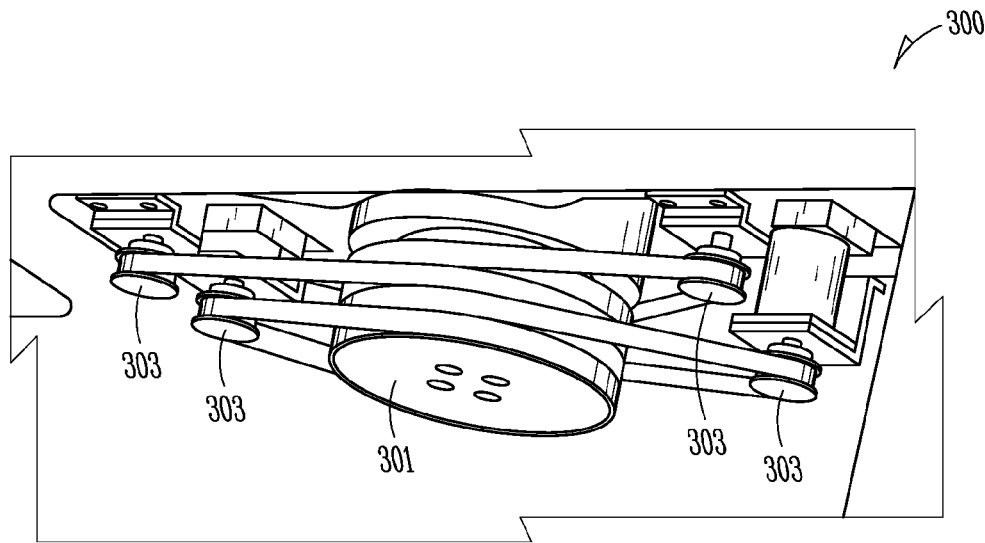
FIG. 3 is a perspective view of an exemplary motion drive hub to provide driving force for the clock-arm substrate carrier system of FIG. 2.

With reference now to FIG. 3, an exemplary embodiment of a rotary drive system 300 includes a hub containing four concentrically mounted arm drive gears 301, one for each of the rotary arms 201 (see FIG. 2). Four drive motors 303 are employed, one for each of the concentrically mounted arm drive gears 301. Each of the rotary arms 201 can be individually driven by employing a separate motor for each of the rotary arms 201. In various other exemplary embodiments, more than one of the rotary arms 201 may be coupled one to another and therefore only require a single motor for operation of the coupled arms.

Drive power is transferred from each of the drive motors 303 to a respective one of the concentrically mounted arm drive gears 301 by, for example, a belt. Although other drive systems may be employed, the belt drive system enhances overall system efficiency over alternative systems such as gear drives. Further, the balanced overall system design (e.g., the symmetrically designed arrangement of the rotary arms 201 in this exemplary embodiment) allows for very low power consumption for each of the four drive motors 303. In this exemplary embodiment, typical power consumption is only about 4.5 watts per motor. A skilled artisan will recognize that other types of rotary drive schemes may be employed as well.

In a specific exemplary embodiment, each of the drive motors 303 may be a standard NEMA 23 frame dimensions such as an SM2315D servo motor with an integral encoder (available from Animatics Corporation, 3200 Patrick Henry Drive, Santa Clara, Calif., USA). Each of the drive motors 303 in this embodiment can be based on a fully-integrated, closed loop servo technology and may incorporate internal, non-volatile memory allowing velocity profile programs to be downloaded from a host computer (e.g., such as the first operator control interface 115A or the second operator control interface 115B) and saved independently to each motor. Further, in this specific exemplary embodiment, all input, output, and internal status information is accessible through defined variables for program monitoring and control. Gear reduction may be accomplished with, for example, a 50:1 planetary reducer and a 4:1 drive belt reduction thus providing 400,000 counts per revolution with a 2000 encoder count per revolution stepper motor. This specific exemplary embodiment allows for a maximum speed of approximately 1 meter/second and a maximum acceleration of 0.1 g or 0.98 meters/second. Accordingly, the rotary arms 201 (see FIG. 2) can move at a maximum angular velocity of approximately 12.5 revolutions per minute.

Figure 4A:
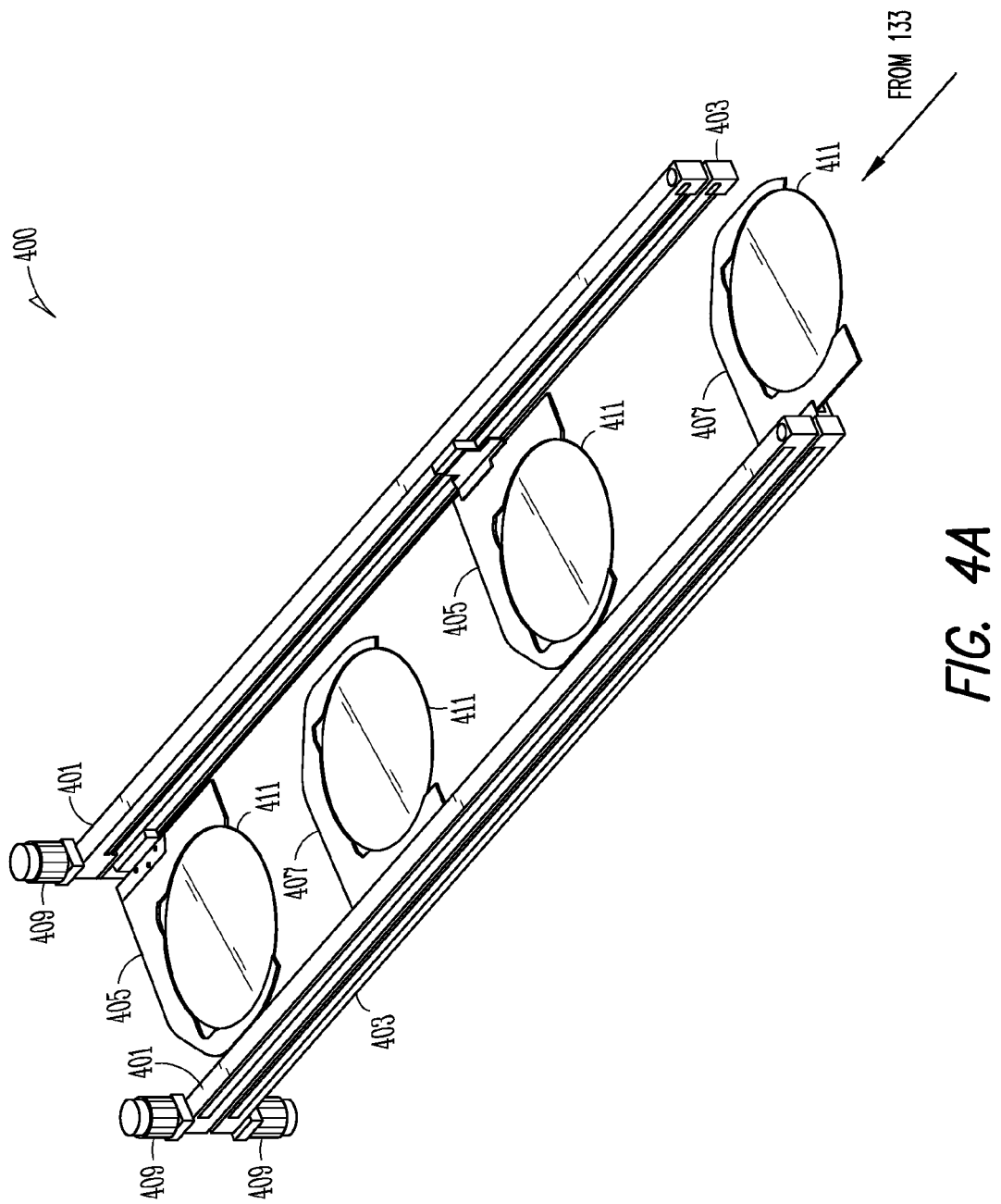
FIG. 4A is a perspective view of an exemplary substrate traverser mechanism used within the process chamber of FIG. 1B.

With reference now to FIG. 4A, an exemplary embodiment of a substrate traverser mechanism 400 is shown to include a pair of upper tracks 401, a pair of lower tracks 403, a pair of right-mounted substrate carriers 405, and a pair of left-mounted substrate carriers 407. The substrate carriers, as shown, are movable in different planes that are parallel to one another as well as being in planes parallel to the rotary arms 201 of the clock-arm substrate carrier mechanism 200. Each of the carriers is also shown as holding a semiconductor substrate 411 merely to assist in describing the overall movement and transport of substrates, below. An indication of where the substrate traverser mechanism 400 is located in reference to the substrate transport slot 133 is also shown in FIG. 4A.

Each of the pair of right-mounted substrate carriers 405 and the pair of left-mounted substrate carriers 407 is driven in a linear manner independently by a motor 409. The motor can be selected from a number of motor types, such as the standard NEMA 23 motor discussed, above, with reference to FIG. 3. Although not shown explicitly, the carriers are driven by the motor 409 associated with a given carrier by a linear actuator (e.g., a linear belt drive system). Such linear actuator systems are known independently in the art. For example, a Festo® EGC-50 belt driven linear actuator (manufactured by FESTO KG, Ruiter Strasse 82, Esslingen, Federal Republic of Germany) may be employed as a carrier drive mechanism for the substrate traverser mechanism 400.

As described herein in various exemplary embodiments, the substrate traverser mechanism 400 is shown to have only a particular number of tracks, substrate carriers, motors, and associated drive mechanisms. However, a skilled artisan will recognize that the concepts described herein may readily be extrapolated to any number or tracks and substrate carriers.

Figure 4B:
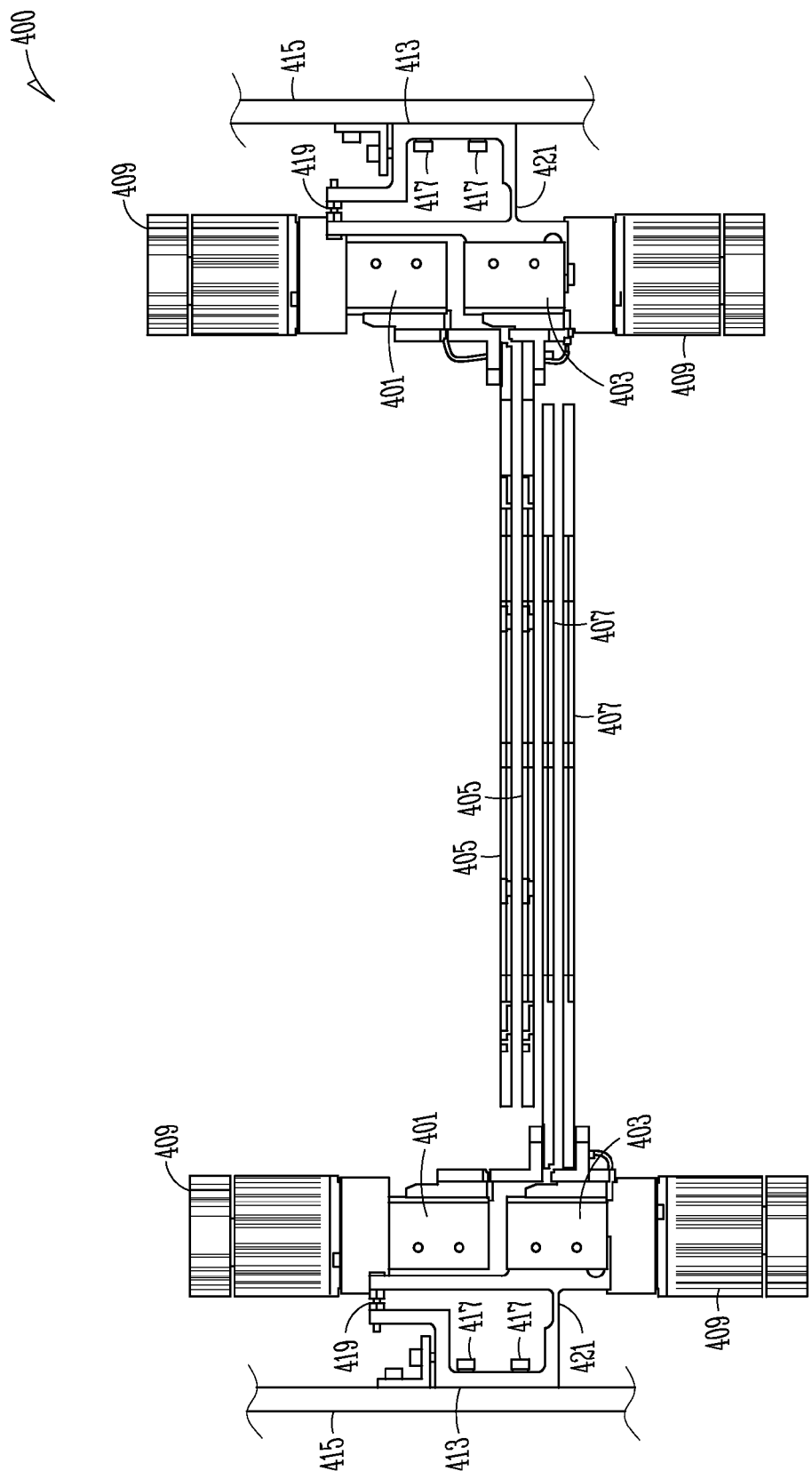
FIG. 4B is a front elevational view of the exemplary substrate mechanism system of FIG. 4A.

FIG. 4B shows a front elevational view of the substrate traverser mechanism 400 to understand better various relationships of the different components in this embodiment. The front elevational view is shown from a perspective of the substrate transport slot 133 (see FIGS. 1B and 4A). Each of the pair of upper tracks 401 and the pair of lower tracks 403 is attached to a structure 415 within the process chamber (see FIG. 1B) through mounting brackets 413 at, for example, the front and back portions of the tracks. The mounting brackets 413 can be coupled to the structure 415 with machine screws 417 through slots (not shown) to provide vertical adjustment of the tracks. An angular adjustment can be achieved by, for example, horizontally located machine screws 419 placed at an upper portion of each of the mounting brackets 413 with a flexure 421 in a narrowed portion of a lower portion of the mounting brackets 413. The pair of right-mounted substrate carriers 405 and the pair of left-mounted substrate carriers 407 can be arranged in certain exemplary embodiments such that, for example, the pair of left-mounted substrate carriers 407 is mounted lower (e.g., 20 mm) pair of right-mounted substrate carriers 405. This arrangement can be advantageous is certain processing situations where, for example, clean substrates are contained on the pair of right-mounted substrate carriers 405 (e.g., the upper pair of carriers) are mounted above pre-processed ("dirty") substrates on the pair of left-mounted substrate carriers 407 (e.g., the lower) pair of carriers). Further, each of the right-mounted substrate carriers 405 and the left-mounted substrate carriers 407 may be spaced at a distance substantially the same the end-effector spacing (e.g., approximately 10 mm) of the front-end robot and the FOUP 113 (see FIG. 1A) as described, above. An overall arrangement of the substrate traverser mechanism 400, as described, allows a multiple substrate hand-off at a point where the substrate carriers of the substrate traverser mechanism 400 are vertically aligned with one another. With each of the right-mounted substrate carriers 405 and the left-mounted substrate carriers 407 spaced 10 mm from one another, the robot that loads and unloads can pick multiple substrates (e.g., two in this case) from the FOUP 113 at one time and place them on the substrate traverser mechanism 400 substantially simultaneously.

Figure 5:
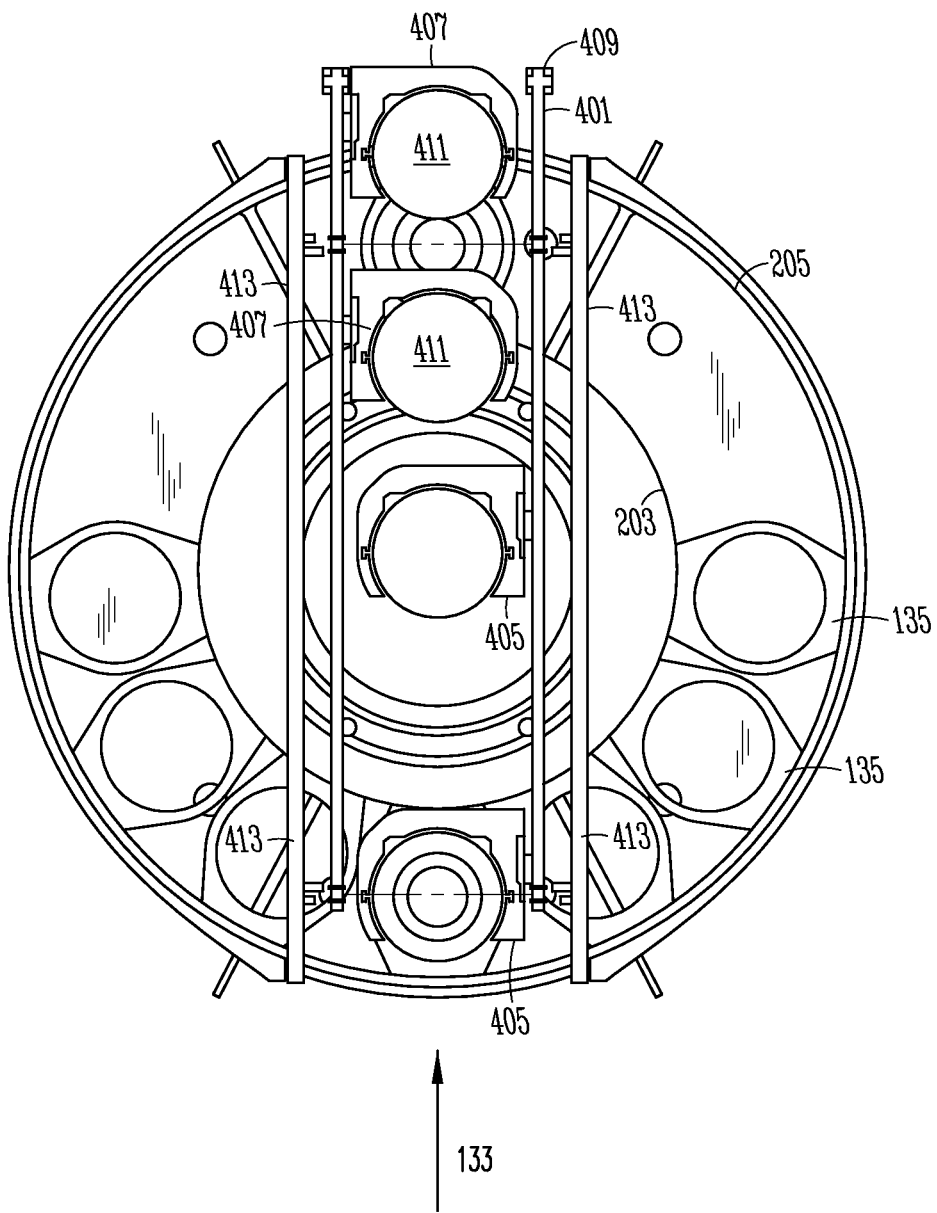
FIG. 5 is a plan view of the clock-arm substrate carrier mechanism of FIG. 2 used in conjunction with the substrate traverser mechanism of FIGS. 4A and 4B in an exemplary embodiment.

Referring now to FIG. 5, an exemplary embodiment shows a plan view of the clock-arm substrate carrier mechanism 200 (see FIG. 2) in conjunction with the substrate traverser mechanism 400 (see FIGS. 4A and 4B). In this exemplary embodiment, the substrate traverser mechanism 400 operates above the clock-arm substrate carrier mechanism 200.

An exemplary operation of the combined clock-arm/traverser mechanism is now described with concurrent reference to FIGS. 2 and 5. After a substrate has been processed in the process chamber 131 (see FIG. 1B), one of the rotary arms 201 is temporarily stopped above one of the substrate lifters 207 (e.g., the lifter located opposite the substrate transport slot 133). The substrate lifter 207 raises the semiconductor substrate 411 from the substrate carrier 135 located on the rotary arm 201. If not already in place, one of the substrate carriers on the substrate traverser mechanism 400, for example, one of the right-mounted substrate carriers 405, is traversed to a position behind (i.e., at or near an extreme position of the traverser end opposite the substrate transport slot 133) the substrate lifter 207. The substrate lifter 207 then raises the semiconductor substrate 411 high enough to clear an uppermost carrier surface of the right-mounted substrate carrier 405. The carrier then moves laterally to receive (i.e., to center the carrier under the substrate-laden lifter) the semiconductor substrate 411 and the substrate lifter 207 lowers, thus placing the substrate onto the right-mounted substrate carrier 405. The substrate lifter 207 continues to lower below a plane formed by a lowermost portion of the substrate carrier 135. At this point in time, the rotary arm 201, previously stopped, may be moved to another position. Once the semiconductor substrate 411 is mounted onto the right-mounted substrate carrier 405, the substrate may be linearly transported to the substrate transport slot 133 and transferred back into a slot in the FOUP 113 (see FIG. 1A) by the robot (not shown).

Substantially concurrent with the substrate removal process just described, an unprocessed substrate may be removed, by the robot, from the FOUP 113 and placed on, for example, one of the left-mounted substrate carriers 407. (Recall, with reference again to FIG. 4B, that the left-mounted substrate carriers 407 may be considered as dirty-substrate carriers and the right-mounted substrate carriers 405 may be considered as clean-substrate carriers). Using one of the substrate lifters 207, the unprocessed substrate may be placed on a substrate carrier of one of the rotary arms 201 that is now stopped. For example, the unprocessed substrate may be placed on the same substrate carrier 135 from which the processed substrate, described above, was just removed. (Recall, with continued reference to FIG. 4B, that each of the substrate carriers on the substrate traverser mechanism 400 is moved laterally at a different elevational height than one another thus avoiding interference between the processed substrate being removed from the process chamber 131 and the unprocessed substrate coming into the process chamber 13.) Alternatively, the unprocessed substrate may be placed on a substrate carrier on the opposite end of the rotary arm 201 from which the processed wafer was removed. In yet another alternative, the unprocessed substrate may be placed on a substrate carrier on either end of any of the rotary arms 201. As a skilled artisan will recognize, additional rotary arms, substrate lifters, and linear substrate carriers may be added further to enhance substrate throughput.

Further, the described design of the clock-arm substrate carrier mechanism 200 and the substrate traverser mechanism 400 allows for each hand-off of a substrate to be a single axis movement. For example, a hand-off requires two components, a first mechanism to transfer the substrate and a second mechanism to receive the substrate. However, as described herein, one of the two mechanisms is not moving (i.e., it is stationary) thus increasing reliability of substrate transfer operations with substantially reduced communications issues between the two mechanisms (e.g., less stringent timing issues since one mechanism is not moving). Thus, the robot always has a relatively fixed location with which to move a substrate. The fixed location is coupled with a generous time interval (due to the rotary arms 201 of the clock-arm substrate carrier mechanism 200 being independent from one another). Consequently, a high throughput of over 500 substrates per hour can readily be achieved. Additionally, except for the robot, all movements discussed herein are single axis allowing the clock-arm substrate carrier mechanism 200 and the substrate traverser mechanism 400 to be produced relatively inexpensively.

Figure 6:
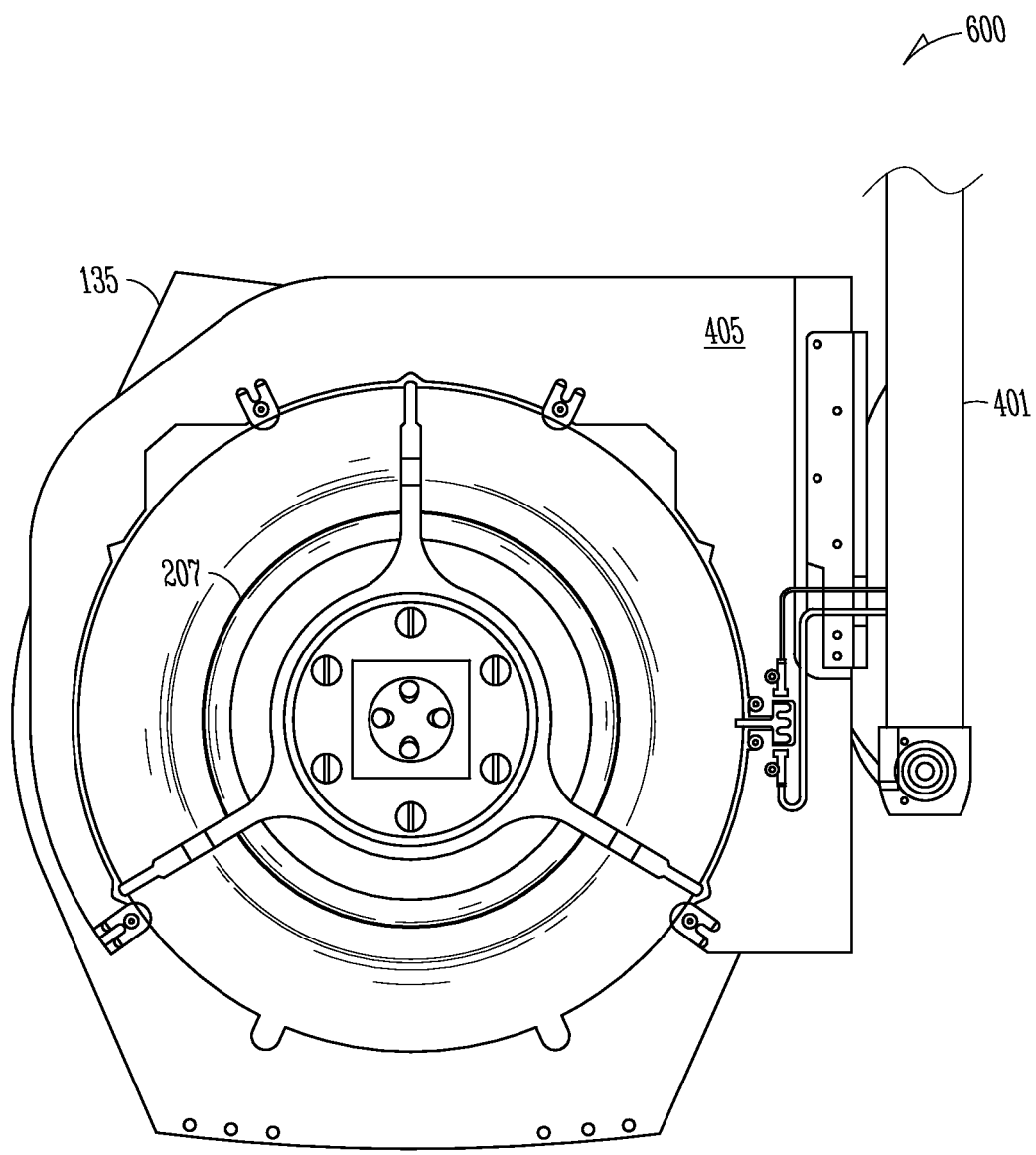
FIG. 6 is a detailed plan view of a lifter mechanism used with the exemplary clock-arm substrate carrier mechanism of FIG. 2 and the exemplary substrate traverser mechanism of FIGS. 4A and 4B.

With continued reference to FIG. 5 and now additionally to FIG. 6, a detailed plan view 600 of one of the substrate lifters 207 used with the clock-arm substrate carrier mechanism 200 (see FIG. 2) and the substrate traverser mechanism (see FIG. 4) is shown. Notice that the c-shaped structure of the right-mounted substrate carriers 405 and the left-mounted substrate carriers 407 allows either of the substrate lifters 207 to be raised and lowered without interference from the substrate carriers. As the substrate lifter 207 is raised vertically (i.e., out of the plane of the drawing paper), fingers of the substrate lifter 207 traverse slots in the substrate carrier 135. As the substrate lifter 207 continues to be raised, the left-mounted substrate carrier 407 can be moved laterally down the drawing page until it is concentric (i.e., centered with) around the fingers of the substrate lifter 207 and, consequently, the substrate (not shown in this view to ensure clarity). The substrate lifter 207 then lowers (i.e., back into the drawing page) and the substrate is then captured and held by the left-mounted substrate carrier 407. Although the c-shaped structure is not required for aspects of the inventive subject matter described herein to function, a skilled artisan will recognize some operational advantages of the c-shaped carrier. Additionally, the skilled artisan will appreciate that, since all of the rotary arms 201 can be moved independently of one another, when one of the arms stops to be either loaded or unloaded, the other arms may continue to move, thereby greatly increasing efficiency and throughput of the overall system.

A skilled artisan will recognize that the exemplary system for substrate load and unload mechanisms for high throughput described herein can be implemented on various tools and at multiple points in a process line. The skilled artisan will further recognize that the system can readily be incorporated into a plurality of both process and metrology tools in various portions of a typical fabrication facility (e.g., in front-end-of-line, back-end-of-line, and test operations).

Moreover, although an overview of the inventive subject matter has been described with reference to specific exemplary embodiments, various modifications and changes may be made to these embodiments without departing from the broader spirit and scope of the present invention. Such embodiments of the inventive subject matter may be referred to herein, individually or collectively, by the term "invention" merely for convenience and without intending to voluntarily limit the scope of this application to any single invention or inventive concept if more than one is, in fact, disclosed. The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

Moreover, plural instances may be provided for structural elements or operations described herein as a single instance. Other allocations of functionality are envisioned. The other allocations may fall within a scope of various embodiments of the present inventive subject matter. In general, structures and functionality presented as separate resources in the exemplary configurations may be implemented as a combined structure or resource. Similarly, structures and functionality presented as a single resource may be implemented as separate resources.

Additionally, many industries allied with the semiconductor industry could make use of the systems described herein. For example, a thin-film head (TFH) process in the data storage industry, an active matrix liquid crystal display (AM-LCD) in the flat panel display industry, or the micro-electro-mechanical (MEM) industry could readily make use of the systems and techniques described. The term "semiconductor" should thus be recognized as including the aforementioned and related industries. These and other variations, modifications, additions, and improvements fall within a scope of the present invention as represented by the appended claims. The specification and drawings are, accordingly, to be regarded in an illustrative rather than a restrictive sense.

What is claimed is:

1. A substrate carrier system, to provide a high substrate throughput, the system comprising:
a plurality of carrier arms each having a midpoint between opposing ends and arranged to rotate about the midpoint in planes parallel to one another, the plurality of carrier arms each further having at least one rotary-mounted substrate carrier mounted on each of the opposing ends;
a hub including a plurality of concentrically-mounted drives, each of the plurality of drives being coupled near the midpoint of a respective one of the plurality of carrier arms, each of the plurality of concentrically-mounted drives being configured to move respective ones of the plurality of carrier arms in at least a full 360° arc in either direction simultaneously, at least a portion of the plurality of carrier arms configured to be driven independently of a remaining portion of the plurality of carrier arms;
a drive motor coupled respectively to each of the concentrically-mounted drives and configured to move a coupled one of the plurality of carrier arms in a rotary manner;
a linear traverser mechanism coupled in proximity to the plurality of carrier arms, the linear traverser mechanism having a plurality of linear substrate carriers mounted thereon, each of the plurality of linear substrate carriers being configured to transport substrates independently of the plurality of carrier arms and in a plane substantially parallel to the planes of the plurality of carrier arms with each of the plurality of linear substrate carriers being in a different plane from one another; and
an inner track section and an outer track section each mounted concentrically with the hub and arranged to support, respectively, an inner periphery and an outer periphery of each of the rotary-mounted substrate carriers.

2. The substrate carrier system of claim 1, further comprising at least one substrate transport slot positioned proximal to an outer periphery of a rotational path traversed by the plurality of carrier arms.

3. The substrate carrier system of claim 2, further comprising a substrate lifter positioned beneath the rotational path traversed by the plurality of carrier arms and positioned on a radial line between the midpoint of the plurality of carrier arms and the at least one substrate transport slot.

4. The substrate carrier system of claim 1, wherein a transport plane of each of the plurality of linear substrate carriers is positioned approximately 10 mm from one another.

5. The substrate carrier system of claim 1, wherein each of the plurality of linear substrate carriers is independently driven by a separate motor.

6. The substrate carrier system of claim 1, further comprising a substrate processing chamber coupled to the plurality of carrier arms.

7. The substrate carrier system of claim 1, wherein the linear traverser mechanism is operationally coupled above the plurality of carrier arms.

8. The substrate carrier system of claim 1, wherein each of the plurality of linear substrate carriers has a c-shaped structure to position one of the substrates concentrically above a substrate lifter.

9. The substrate carrier system of claim 1, wherein the linear traverser mechanism further comprises:
   at least two upper tracks;
   at least two lower tracks; and
   linear drive mechanisms respectively coupled to each of the at least two upper tracks and the two lower tracks, each of the plurality of linear substrate carriers mechanically coupled to a unique one of the linear drive mechanisms.

10. The substrate carrier system of claim 9 wherein the at least one chemical-release head is positioned above a path of the rotary-mounted substrate carriers.

11. The substrate carrier system of claim 9 wherein the at least one chemical-release head is positioned below a path of the rotary-mounted substrate carriers.

12. The substrate carrier system of claim 9 wherein the at least one chemical-release head has a wider cross-sectional width at an outer periphery of the head than at an inner periphery of the head.

13. The substrate carrier system of claim 1 further comprising at least one chemical-release head, the at least one chemical release head being positioned proximate to a rotational path of each of the rotary mounted substrate carriers.

14. A substrate carrier system, comprising:
   a plurality of carrier arms each having a midpoint between opposing ends and arranged to rotate about the midpoint in planes parallel to one another, the plurality of carrier arms each further having at least one rotary-mounted substrate carrier mounted on each of the opposing ends;
   a hub including a plurality of concentrically-mounted drives, each of the plurality of drives being coupled near the midpoint of a respective one of the plurality of carrier arms, each of the plurality of concentrically-mounted drives being configured to move respective ones of the plurality of carrier arms, at least a portion of the plurality of carrier arms configured to be driven independently of a remaining portion of the plurality of carrier arms;
   a drive motor coupled respectively to each of the concentrically-mounted drives and configured to move a coupled one of the plurality of carrier arms in a rotary manner; and
   an inner track section and an outer track section each mounted concentrically with the hub and arranged to support, respectively, an inner periphery and an outer periphery of each of the rotary-mounted substrate carriers.

* * * * *